(12) United States Patent
Zhou et al.

(10) Patent No.: US 10,772,220 B2
(45) Date of Patent: Sep. 8, 2020

(54) DUMMY CORE RESTRICT RESIN PROCESS AND STRUCTURE

(71) Applicant: Multek Technologies Limited, San Jose, CA (US)

(72) Inventors: J L Zhou, Guangdong (CN); Pui Yin Yu, Tsuen Wan (HK)

(73) Assignee: Multek Technologies Limited, Irvine, CA (US)

( * ) Notice: Subject to any disclaimer, the term of this patent is extended or adjusted under 35 U.S.C. 154(b) by 0 days.

(21) Appl. No.: 16/552,723

(22) Filed: Aug. 27, 2019

(65) Prior Publication Data

US 2020/0015365 A1    Jan. 9, 2020

Related U.S. Application Data

(62) Division of application No. 15/064,437, filed on Mar. 8, 2016, now abandoned.

(30) Foreign Application Priority Data

Feb. 17, 2016    (CN) .......................... 2016 1 0090048

(51) Int. Cl.
*H05K 3/36* (2006.01)
*H05K 3/46* (2006.01)

(52) U.S. Cl.
CPC . *H05K 3/4691* (2013.01); *H05K 2201/09781* (2013.01); *H05K 2203/308* (2013.01); *Y10T 29/49155* (2015.01)

(58) Field of Classification Search
CPC ........ H05K 3/4691; H05K 2201/09781; Y10T 29/49128; Y10T 29/49155; Y10T 29/49165

(Continued)

(56) References Cited

U.S. PATENT DOCUMENTS 4,165,557 A    8/1979  Taguchi et al.
4,338,149 A    7/1982  Quaschner
                (Continued)

FOREIGN PATENT DOCUMENTS

JP    2008078454 A    4/2008
JP    2015012022 A    1/2015
        (Continued)

OTHER PUBLICATIONS

U.S. Patent and Trademark Office, "Advisory Action", U.S. Appl. No. 15/064,437, dated Jun. 4, 2019, 3 pgs.

(Continued)

*Primary Examiner* — Donghai D Nguyen
(74) *Attorney, Agent, or Firm* — Carlson, Caspers, Vandenburgh & Lindquist, P.A.

(57) ABSTRACT

A printed circuit board (PCB) has multiple layers, where select portions of inner layer circuitry, referred to as inner core circuitry, are covered by a coverlay material and the covered inner core circuitry is exposed from the remaining layers of the PCB. The PCB having covered inner core circuitry is formed using a dummy core plus coverlay process. The select inner core circuitry is part of an inner core. The inner core corresponding to the covered inner core circuitry forms a flexible PCB portion. The flexible PCB portion is an extension of the remaining adjacent multiple layer PCB. The remaining portion of the multiple layer PCB is rigid. The inner core is common to both the flexible PCB portion and the remaining rigid PCB portion.

27 Claims, 12 Drawing Sheets

(58) Field of Classification Search
USPC .................................... 29/831, 846, 852
See application file for complete search history.

(56) References Cited

U.S. PATENT DOCUMENTS

| | | | |
|---|---|---|---|
| 4,356,619 | A | 11/1982 | Snyder et al. |
| 4,630,172 | A | 12/1986 | Stenerson et al. |
| 4,691,419 | A | 9/1987 | Keeler et al. |
| 4,726,114 | A | 2/1988 | Staviski |
| 4,941,516 | A | 7/1990 | Weiswurm |
| 5,004,639 | A | 4/1991 | Desai |
| 5,116,440 | A | 5/1992 | Takeguchi et al. |
| 5,121,297 | A | 6/1992 | Haas |
| 5,153,050 | A * | 10/1992 | Johnston ............ B32B 37/26 428/209 |
| 5,159,750 | A | 11/1992 | Dutta et al. |
| 5,175,047 | A | 12/1992 | McKenney et al. |
| 5,206,463 | A | 4/1993 | DeMaso et al. |
| 5,227,223 | A | 7/1993 | Morgan et al. |
| 5,347,712 | A | 9/1994 | Yasuda et al. |
| 5,409,884 | A | 4/1995 | Harada et al. |
| 5,459,639 | A | 10/1995 | Izumi |
| 5,784,782 | A | 7/1998 | Boyko et al. |
| 5,876,859 | A | 3/1999 | Saxelby, Jr. et al. |
| 6,031,281 | A | 2/2000 | Kang et al. |
| 6,090,237 | A | 7/2000 | Reynolds et al. |
| 6,214,525 | B1 | 4/2001 | Boyko et al. |
| 6,224,965 | B1 * | 5/2001 | Haas ............ H05K 1/0373 428/209 |
| 7,037,561 | B2 | 5/2006 | Narita et al. |
| 7,281,328 | B2 | 10/2007 | Lee et al. |
| 7,313,464 | B1 | 12/2007 | Perreault et al. |
| 7,576,288 | B2 | 8/2009 | Kondo et al. |
| 7,898,068 | B2 | 3/2011 | Smeys et al. |
| 8,020,292 | B1 | 9/2011 | Kumar et al. |
| 8,278,565 | B2 | 10/2012 | Honjo et al. |
| 8,519,270 | B2 | 8/2013 | Chang |
| 8,558,116 | B2 | 10/2013 | Lee et al. |
| 8,735,739 | B2 | 5/2014 | Ishihara et al. |
| 8,882,954 | B2 * | 11/2014 | Lee ............ H05K 3/4644 156/247 |
| 8,884,166 | B2 | 11/2014 | Inatani |
| 9,338,899 | B2 | 5/2016 | Lee et al. |
| 2001/0010303 | A1 | 8/2001 | Caron et al. |
| 2003/0164077 | A1 | 9/2003 | Hill et al. |
| 2004/0089472 | A1 | 5/2004 | Ninomiya et al. |
| 2004/0219342 | A1 | 11/2004 | Boggs et al. |
| 2005/0005996 | A1 | 1/2005 | Mizutani |
| 2006/0043567 | A1 | 3/2006 | Palanduz |
| 2006/0132427 | A1 | 6/2006 | Weisberg et al. |
| 2006/0254811 | A1 | 11/2006 | Kirstein et al. |
| 2007/0017697 | A1 | 1/2007 | Hsu |
| 2007/0054104 | A1 | 3/2007 | Ittel et al. |
| 2007/0117261 | A1 | 5/2007 | Ueno et al. |
| 2007/0246254 | A1 | 10/2007 | Kumar et al. |
| 2008/0217708 | A1 | 9/2008 | Reisner et al. |
| 2008/0253612 | A1 | 10/2008 | Reyier et al. |
| 2009/0004438 | A1 | 1/2009 | Urakawa |
| 2009/0257707 | A1 | 10/2009 | Shibata et al. |
| 2010/0159765 | A1 | 6/2010 | Jian et al. |
| 2010/0288540 | A1 | 11/2010 | Honjo et al. |
| 2011/0135248 | A1 | 6/2011 | Langer et al. |
| 2011/0163457 | A1 | 7/2011 | Mohan et al. |
| 2012/0024575 | A1 | 2/2012 | Zhang et al. |
| 2012/0181074 | A1 | 7/2012 | Ishihara et al. |
| 2013/0299223 | A1 | 11/2013 | Yoo et al. |
| 2013/0341078 | A1 | 12/2013 | Hardin et al. |
| 2014/0024147 | A1 | 1/2014 | Xie et al. |
| 2014/0301053 | A1 | 10/2014 | Iida et al. |
| 2015/0027627 | A1 | 1/2015 | Lee et al. |
| 2015/0090688 | A1 | 4/2015 | Ajoian |
| 2015/0359149 | A1 | 12/2015 | Itoh et al. |
| 2015/0376444 | A1 | 12/2015 | Saito et al. |
| 2016/0088729 | A1 | 3/2016 | Kobuke et al. |
| 2016/0324012 | A1 | 11/2016 | Qiu et al. |
| 2017/0118879 | A1 | 4/2017 | Nakanishi et al. |
| 2017/0265298 | A1 | 9/2017 | Zhang et al. |

FOREIGN PATENT DOCUMENTS

| | | |
|---|---|---|
| KR | 100887133 B1 | 3/2009 |
| KR | 100891814 B1 | 4/2009 |

OTHER PUBLICATIONS

U.S. Patent and Trademark Office, "Final Office Action", U.S. Appl. No. 15/064,437, dated Feb. 28, 2019, 14 pgs.
U.S. Patent and Trademark Office, "Final Office Action", U.S. Appl. No. 15/064,437, dated Apr. 26, 2018, 14 pgs.
U.S. Patent and Trademark Office, "Final Office Action", U.S. Appl. No. 15/064,437, dated Jun. 27, 2017, 13 pgs.
U.S. Patent and Trademark Office, "Non-Final Office Action", U.S. Appl. No. 14/747,937, dated Mar. 31, 2017, 11 pgs.
U.S. Patent and Trademark Office, "Non-Final Office Action", U.S. Appl. No. 15/064,437, dated Feb. 17, 2017, 12 pgs.
U.S. Patent and Trademark Office, "Non-Final Office Action", U.S. Appl. No. 15/064,437, dated Sep. 4, 2018, 14 pgs.
U.S. Patent and Trademark Office, "Non-Final Office Action", U.S. Appl. No. 15/064,437, dated Oct. 3, 2017, 13 pgs.
U.S. Patent and Trademark Office, "Non-Final Office Action", U.S. Appl. No. 15/087,793, dated Feb. 27, 2018, 11 pgs.
U.S. Patent and Trademark Office, "Non-Final Office Action", U.S. Appl. No. 15/367,679, dated Nov. 1, 2017, 16 pgs.

* cited by examiner

DUMMY CORE RESTRICT RESIN PROCESS AND STRUCTURE

RELATED APPLICATIONS

This application is a divisional application of co-pending U.S. patent application Ser. No. 15/064,437, filed on Mar. 8, 2016, and entitled "Dummy Core Restrict Resin Process and Structure," which is hereby incorporated in its entirety by reference.

FIELD OF THE INVENTION

The present invention is generally directed to printed circuit boards. More specifically, the present invention is directed to printed circuit boards having select exposure of inner layer circuitry.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers in the laminated stack.

In some applications, it is desirable to form part of the printed circuit board with a reduced number of layers, which are flexible, to form a flexible portion that is bendable yet remains interconnected to other rigid portions of the printed circuit board, thereby forming a rigid-flexible printed circuit board. Current process flow is to pre-cut prepreg at a desired flexible portion and then control resin squeeze out during the lamination process. This process flow has disadvantages such as high cost of low flow prepreg, limited supply of low flow prepreg and difficulty in controlling resin squeeze out. Additionally, lamination accessories such as release film and conformal film are needed which also add cost. Release film provides a separation between a surface copper layer (conducting layer) in the lamination stack and the conformal film. Conformal film is a thermoplastic layer which softens under lamination temperature and conforms to the area with prepreg pre-cut. This reduces prepreg resin flowing into the flexible portion. However, resin can still flow into the rigid-flexible boundary randomly, resulting in an irregular rigid-flexible boundary. Such an irregular boundary forms a serrated surface that cuts against the flexible portion. Further, lamination under high pressure and the impact of conformal film can result in increased panel distortion and it is difficult to achieve flat surface for fine line etching or even dielectric thickness across panel to control impedance. A panel here refers to the finished product of the stack of laminate and prepreg after lamination. In order to solve these issues, a new manufacturing process for rigid-flex printed circuit boards is needed.

SUMMARY OF THE INVENTION

Embodiments are directed to a PCB having multiple layers, where select portions of inner layer circuitry, referred to as inner core circuitry, are covered by a coverlay material and the coverlay and inner core circuitry are exposed from the remaining layers of the PCB to form a flexible PCB portion. The PCB having an exposed coverlay and inner core circuitry is formed using a dummy core plus coverlay process. The select inner core circuitry is part of an inner core. During manufacturing of the PCB, a coverlay is applied over the select inner core circuitry and a dummy core is applied over the coverlay. The coverlay and the dummy core protect the select inner core circuitry during subsequent process steps and also enable exposure of the coverlay and select inner core circuitry as described in detail below. The flexible PCB portion is an extension of the remaining adjacent multiple layer PCB. The remaining portion of the multiple layer PCB is rigid, referred to as a rigid PCB portion. The inner core is a layer(s) of the PCB and is therefore common to both the flexible PCB portion and the remaining rigid PCB portion. The flexible PCB portion can be formed as an interior portion of the PCB such that a rigid PCB portion is coupled to either end of the flexible PCB portion.

In an aspect, a printed circuit board is disclosed. The printed circuit board includes a rigid printed circuit board portion and a flexible printed circuit board portion. The rigid printed circuit board portion comprises a laminated stack of a plurality of non-conducting layers and a plurality of conductive layers, wherein the laminated stack further comprises a first portion of an inner core structure. The flexible printed circuit board portion comprises a second portion of the inner core structure, wherein the inner core structure is a continuous structure that extends through both the rigid printed circuit board portion and the flexible printed circuit board portion. The second portion of the inner core structure comprises inner core circuitry and exposed coverlay material covering the inner core circuitry. In some embodiments, each of the conductive layers is pattern etched. In some embodiments, the printed circuit board further comprises one or more plated through hole vias in the rigid printed circuit board portion. In some embodiments, the rigid printed circuit board portion comprises a first rigid printed circuit board portion, further wherein the printed circuit board further comprises a second rigid printed circuit board portion comprising a second laminated stack of a plurality of non-conducting layers and a plurality of conductive layers, wherein the second laminated stack further comprises a third portion of the inner core structure, further wherein the flexible printed circuit board portion is coupled between the first rigid printed circuit board portion and the second rigid printed circuit board portion. In some embodiments, the inner core structure comprises an inner core non-conductive layer having a first surface and a first conductive layer positioned on the first surface of the inner core non-conductive layer. In some embodiments, the first conductive layer of the inner core structure comprises the inner core circuitry in the second portion of the inner core structure. In some embodiments, the inner core non-conductive layer has a second surface opposing the first surface, further wherein the inner core structure further comprises a second conductive layer positioned on the second surface of the inner core non-conductive layer. In some embodiments, the second conductive layer of the inner core structure comprises the inner core circuitry in the second portion of the inner core structure. In some embodiments, the inner core non-conductive layer comprises polyimide. In some embodiments, the coverlay material comprises a combination of polyimide and adhesive.

In another aspect, a printed circuit board set form is disclosed. The printed circuit board set form comprises a plurality of printed circuit boards and breakaway substrate. The plurality of printed circuit boards are aligned within a common plane, wherein each printed circuit board is mechanically connected by a common substrate. Each printed circuit board comprises a rigid printed circuit board portion and a flexible printed circuit board portion. The rigid printed circuit board portion comprises a laminated stack of a plurality of non-conducting layers and a plurality of conductive layers, wherein the laminated stack further comprises a first portion of an inner core structure. The flexible printed circuit board portion comprises a second portion of the inner core structure, wherein the inner core structure is a continuous structure that extends through both the rigid printed circuit board portion and the flexible printed circuit board portion. The second portion of the inner core structure comprises inner core circuitry and exposed coverlay material covering the inner core circuitry. The breakaway substrate is aligned within the common plane and mechanically connected around a perimeter of the connected plurality of printed circuit boards, wherein the breakaway substrate includes a dummy core portion. In some embodiments, the breakaway substrate provides lateral structural stability to the connected plurality of printed circuit boards. In some embodiments, the plurality of printed circuit boards are electrically isolated from each other.

In yet another aspect, a method of manufacturing a printed circuit board is disclosed. The method comprises forming an inner core structure having an inner core circuitry on at least one surface of the inner core structure and applying a coverlay material over the inner core circuitry. The method also comprises forming a printed circuit board stack up, wherein the printed circuit board stack up comprises the inner core structure, a dummy core, one or more non-conductive layers and one or more conductive layers, wherein the dummy core is stacked on the coverlay material. The method also comprises laminating the printed circuit board stack up, thereby forming a laminated stack. The method also comprises forming a depth controlled rout from a surface of the laminated stack to the dummy core and around a perimeter of the dummy core, wherein a portion of the laminated stack within the perimeter of the rout and to a depth including the dummy core forms a laminated stack cap. The method also comprises removing the laminated stack cap, thereby exposing the coverlay material and forming a flexible portion of the printed circuit board. In some embodiments, the perimeter of the dummy core corresponds to a perimeter of the inner core circuitry. In some embodiments, the method also comprises forming the dummy core, wherein the dummy core comprises a non-conductive layer and a conductive layer. In some embodiments, the dummy core is stacked on the coverlay material such that the conductive layer of the dummy core contacts the coverlay material. In some embodiments, the method also comprises forming at least one plated through hole via in the laminated stack prior to forming the depth controlled rout, wherein the at least one plated through hole via is not aligned within the inner core circuitry. In some embodiments, the method also comprises pattern etching the conductive layers in the laminated stack prior to forming the printed circuit board stack up. In some embodiments, forming the inner core structure comprises applying a first conductive layer on a first surface of a non-conductive layer and applying a second conductive layer on a second surface of the non-conductive layer. In some embodiments, the first conductive layer is pattern etched and the second conductive layer is pattern etched. In some embodiments, the one or more non-conductive layers comprise one or more regular flow prepreg layers. In some embodiments, laminating the printed circuit board stack up comprises applying a standard lamination pressure less than about 450 psi. In some embodiments, a remaining portion of the laminated stack outside the perimeter of the rout forms a rigid portion of the printed circuit board, wherein an exposed outer surface of the laminated stack is smooth and non-rippled due to laminating the printed circuit board stack up using regular lamination pressure and the inclusion of regular flow prepreg.

In yet another aspect, another printed circuit board is disclosed. The printed circuit board comprises a rigid printed circuit board portion and a flexible printed circuit board portion. The rigid printed circuit board portion comprises a laminated stack of a plurality of non-conducting layers and a plurality of conductive layers. The plurality of non-conducting layers comprises a plurality of regular flow prepreg layers. An exposed outer surface of the laminated stack is smooth and non-rippled. The laminated stack further comprises a first portion of an inner core structure. The flexible printed circuit board portion comprises a second portion of the inner core structure. The inner core structure is a continuous structure that extends through both the rigid printed circuit board portion and the flexible printed circuit board portion. The second portion of the inner core structure comprises inner core circuitry In some embodiments, the second portion of the inner core structure further comprises an exposed coverlay material covering the inner core circuitry. In some embodiments, the regular flow prepreg layers each comprise prepreg having resin flow greater than about 100 mil. In some embodiments, an exposed lateral surface of the rigid printed circuit board forms a rigid-flexible boundary, wherein the rigid-flexible boundary formed at the exposed lateral surface is substantially smooth and regular.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
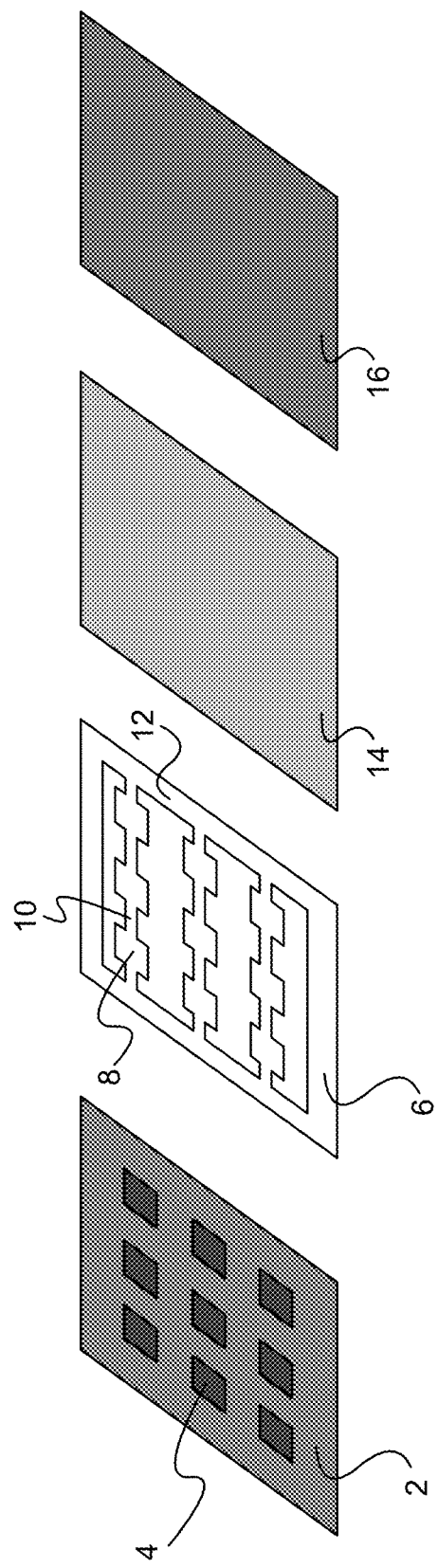
FIG. 1 illustrates a perspective top view of various layers included in a printed circuit board prior to stacking and lamination according to some embodiments.

FIG. 1 illustrates a perspective top view of various layers included in a printed circuit board prior to stacking and lamination according to some embodiments. An inner core 2 includes multiple layers (not shown). In some embodiments, the inner core 2 is FCCL (flexible copper clad laminate) or other non-conductive base material layer having a conductive layer on each surface of the non-conductive layer. In some embodiments, FCCL is made of non-conductive polyimide material with copper on single or double sides. Polyimide is bendable. It is understood that alternative inner core structures can be used which include a conductive layer on only one surface of the non-conductive layer. The conductive layers are patterned and etched to form conductive interconnects. Select portions of the conductive interconnects, referred to as inner core circuitry, are to be part of the flexible PCB portion. Each inner core circuit is covered by a coverlay material, or simply "coverlay". Coverlay is bendable. In some embodiments, coverlay is a combination of polyimide and adhesive. For example, coverlay is not glass reinforced like prepreg.

The dummy core 6 protects the select inner core circuitry covered by the applied coverlay. In some embodiments, the dummy core 6 is a two-layer structure. A first layer is a non-conductive layer, such as a base material. The second layer is a conductive layer, such as a copper foil. The dummy core 6 is shaped similar to an inverted stencil where the stencil pattern is formed of the dummy core material and the area surrounding the pattern is free of material. The pattern of the dummy core 6 includes overlay portions 8 that have substantially the same shape and size as the areas of applied coverlay 4. The pattern of the dummy core 6 also includes interconnect portions 10 that connect the overlay portions 8 and an outer perimeter portion 12. The interconnect portions 10 and the outer perimeter portion 12 of the dummy core pattern provide a stable framework for accurately placing the overlay portions 8 relative to the coverlay 4.

A layer 14 is a non-conductive, insulating layer, such as prepreg. The prepreg used herein is a regular flow prepreg, which enables a regular pressure to be used during a subsequent lamination step, described above. In the PCB industry, "low flow" prepreg, such as that described in the background, is a general term to describe prepreg with lower resin flow than "regular flow" prepreg. "Low flow" prepreg usually has resin flow that is less than 100 mil. "Regular flow" prepreg has resin flow that is greater than 100 mil. A layer 16 is a conductive layer, such as copper foil or laminate, where a laminate includes a non-conductive layer such as base material and a conductive layer on one or both sides of non-conductive layer. In some embodiments, the layer 16 is representative of a multilayer buildup that can include many interspersed conductive and non-conductive layers.

Figure 2:
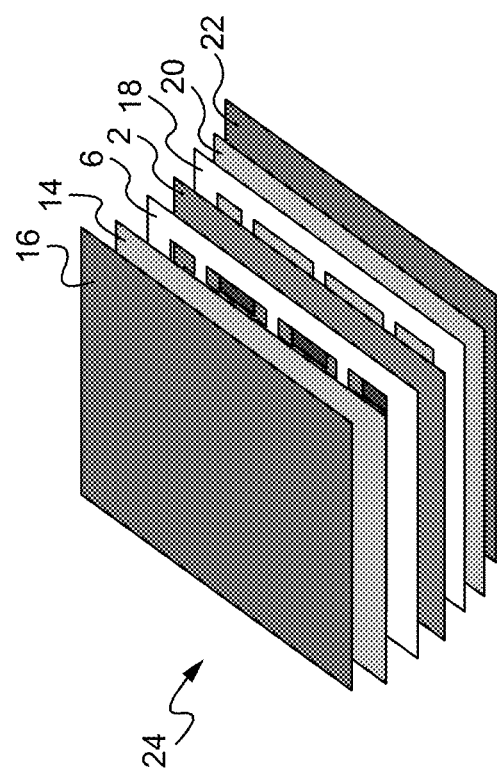
FIG. 2 illustrates an exemplary PCB stack-up 24 according to some embodiments.

A PCB stack-up is formed by stacking various combinations of the layers, or similar to the layers, shown in FIG. 1. FIG. 2 illustrates an exemplary PCB stack-up 24 according to some embodiments. The stack-up 24 includes the inner core 2, the dummy core pattern 6, the non-conductive layer 14, the conductive layer 16, a dummy core pattern 18, a non-conductive layer 20 and a conductive layer 22. The dummy core pattern 18 can be patterned the same as the dummy core pattern 6 or differently depending on the inner core circuitry and coverlay patterns applied on a back side (not shown) of the inner core 2. The non-conductive layer 20 can be similar to the non-conductive layer 14. The conductive layer 22 can have the same or different patterned interconnects as the conductive layer 16. The conductive layer 16 can represent a single layer or a multilayer buildup, and the conductive layer 22 can represent a single layer or multilayer buildup independently configured than the conductive layer 16.

Figure 3:
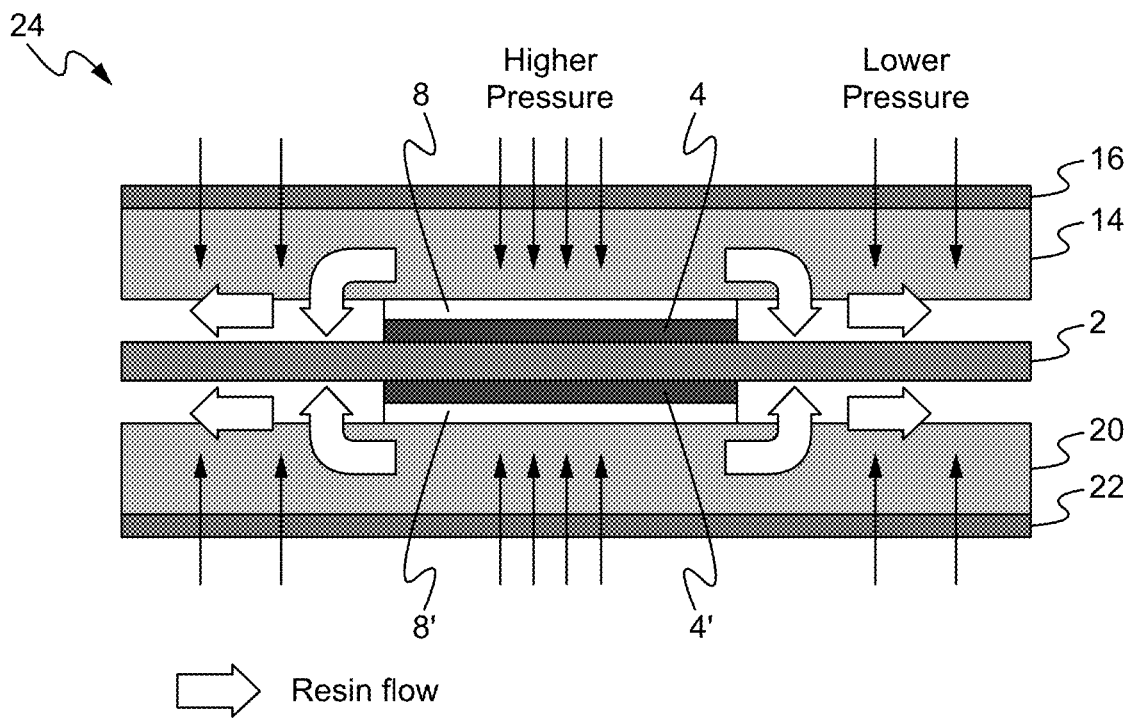
FIG. 3 illustrates a cut out side view of a portion of the PCB-stack-up shown in FIG. 2 as a lamination step is performed.
Figure 4:
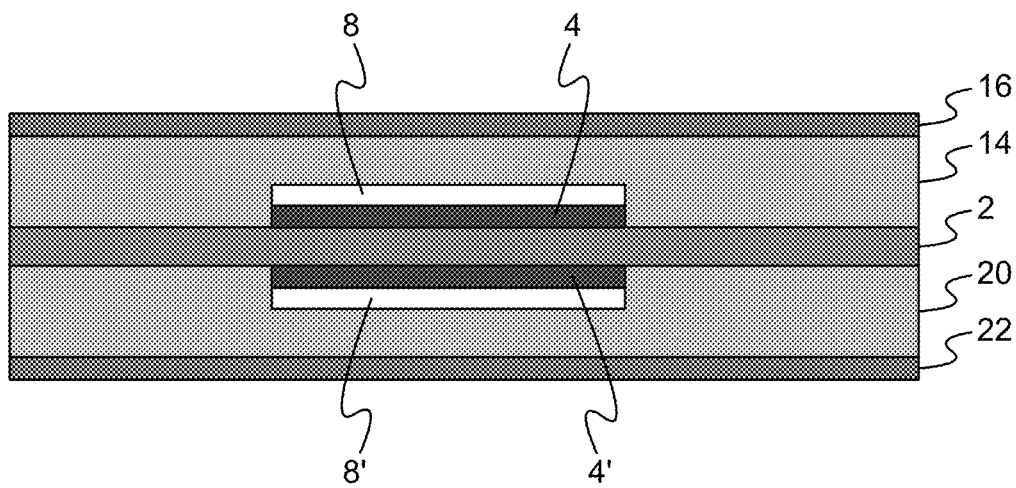
FIG. 4 illustrates a cut out side view of the PCB stack-up of FIG. 3 after lamination.

A laminated stack is formed by laminating the PCB stack-up shown in FIG. 2. Any conventional lamination technique can be used. FIG. 3 illustrates a cut out side view of a portion of the PCB-stack-up shown in FIG. 2 as a lamination step is performed. The portion of the PCB stack-up shown in FIG. 3 coincides with an overly portion 8 of the dummy core pattern 6 and a coverlay portion 4 applied over inner core circuitry of the inner core 2. An overlay portion 8' of the dummy core pattern 18 of FIG. 2 and a coverlay portion 4' applied over backside inner core circuitry of the inner core 2 is also shown. With the dummy core positioned on the coverlay, the dummy core touches firmly with the coverlay under standard lamination pressure. As used herein, standard lamination pressure refers to the lamination pressure used with "regular flow" prepreg. With "regular flow" prepreg, lamination pressure is less than about 450 psi. With "low flow" prepreg, lamination pressure is more than about 450 psi. A total thickness of the dummy core and coverlay is thicker than an adjacent area such that a uniform pressure applied across the entire top and bottom surfaces of the PCB stack-up results in a higher relative pressure applied at the areas corresponding to the dummy core. Prepreg resin flows into the adjacent area under lower pressure. Prepreg resin flow into the coverlay is restricted by the dummy core as well as the higher relative pressure. The coverlay and the dummy core provide structural support during the lamination step so as to provide protection to the inner core circuitry. FIG. 4 illustrates a cut out side view of the PCB stack-up of FIG. 3 after lamination.

Figure 5:
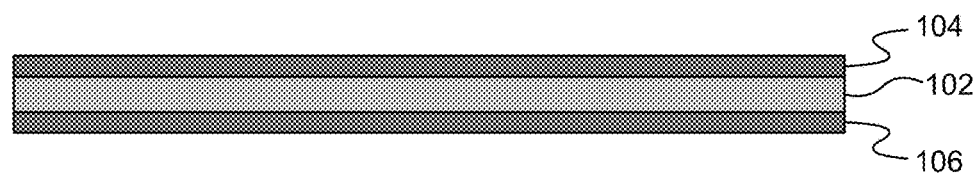
FIGS. 5-14 illustrate various steps in the process used to manufacture a printed circuit board according to some embodiments.

FIGS. 5-14 illustrate various steps in the process used to manufacture a printed circuit board according to some embodiments. The printed circuit board manufactured using the various steps shown in FIGS. 5-14 is similar to and shares features of the printed circuit boards and constituent layers shown in FIGS. 1-4. Each of the FIGS. 5-14 illustrate a cut out side view of the printed circuit board according to the various process steps. In FIG. 5, an exemplary inner core structure is shown. The inner core structure is a metal clad structure including a bendable non-conductive layer 102 and conductive layers 104, 106 formed on both opposing surfaces. It is understood that an alternative inner core structure can be used which includes a conductive layer on only one surface of the non-conductive layer. In some embodiments, the inner core structure is an FCCL.

Figure 6:
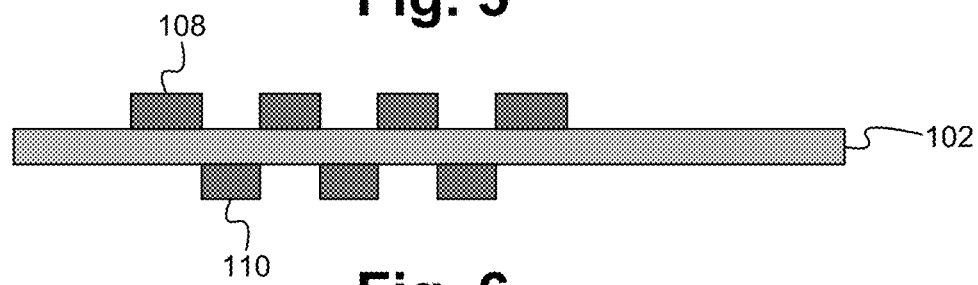

In FIG. 6, the conductive layers 104 and 106 are selectively pattern etched to form inner core circuitry 108 and 110, respectively. Alternatively, the conductive layers 104, 106 are already pattern etched during fabrication of the inner core structure in FIG. 5. It is understood that FIG. 5-14 only show a portion of the printed circuit board and in particular only show a portion of the inner core structure. Additional interconnects and circuitry may be formed on portions of the inner core structure not shown in FIGS. 5-14, those portions to be included as part of a rigid PCB portion of the printed circuit board.

Figure 7:
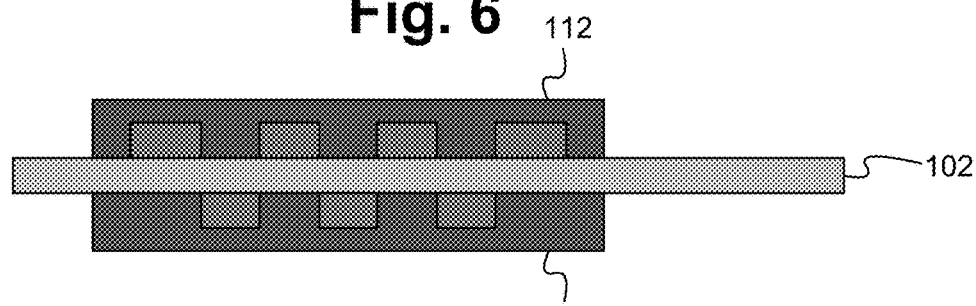

In FIG. 7, coverlay 112, 114 is applied on the inner core circuitry 108 and 110, respectively. The resulting structure forms an inner core assembly wherein the inner core circuitry is encapsulated by the coverlay. The coverlay has a low adhesion to a conductive layer, such as copper, of a dummy core as described in detail below.

Figure 8:
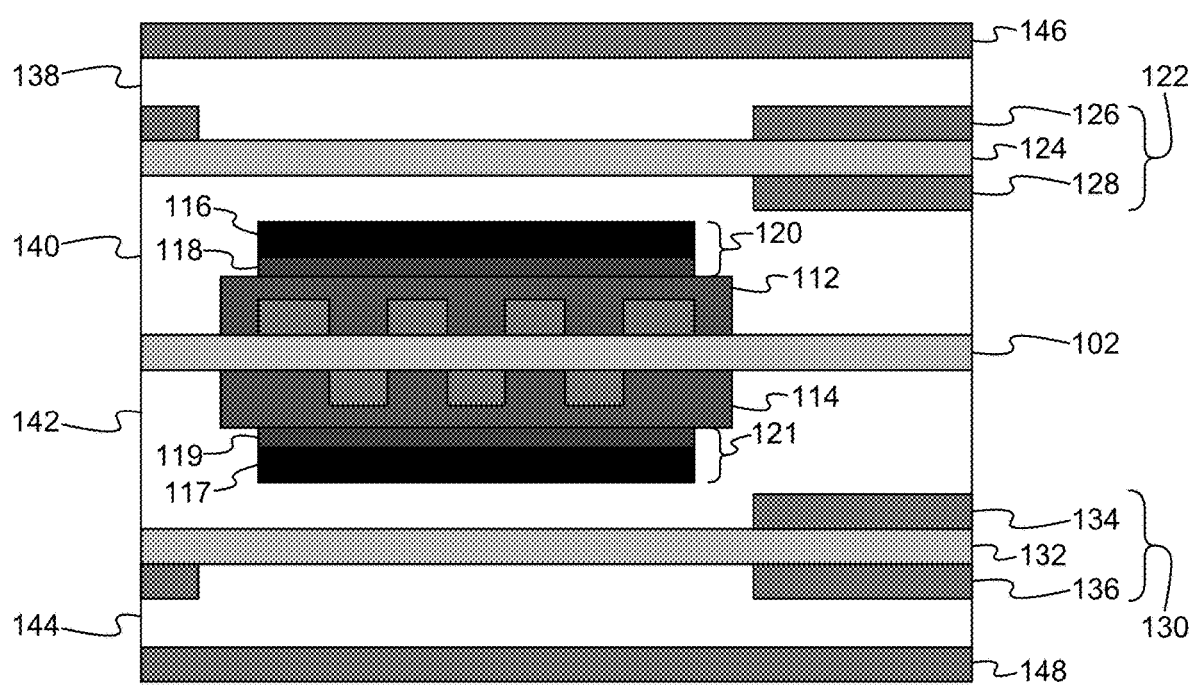

In FIG. 8, additional core structures and dummy core structures are fabricated, and the core structures, the inner core assembly and the dummy core structures are stacked with intervening non-conductive layers, such as regular flow prepreg. The additional core structures can be similar to the inner core structure of FIG. 5 with the conductive layers pattern etched accordingly. However, the conductive layers of the additional core structures are formed such that the resulting interconnects will be positioned in a rigid PCB portion of the resulting printed circuit board. In most instances, the additional core structures are made using a non-conductive base material as opposed to FCCL. In the exemplary configuration shown in FIG. 8, two additional core structures are included. A first core structure 122 includes a non-conductive layer 124 and conductive layers 126 and 128. The conductive layers 126 and 128 are selectively pattern etched. As shown in FIG. 8, the portions of the conductive layers 126 and 128 aligned with the inner core circuitry 108 are removed. However, removal of the conductive layers 126 and 128 is optional and in other embodiments these portions of the conductive layers 126 and 128 may remain. A second core structure 130 includes a non-conductive layer 132 and conductive layers 134 and 136. The conductive layers 134 and 136 are selectively pattern etched. As shown in FIG. 8, the portions of the conductive layers 134 and 136 aligned with the inner core circuitry 110 are removed. However, removal of the conductive layers 134 and 136 is optional and in other embodiments these portions of the conductive layers 134 and 136 may remain.

A dummy core 120 is positioned on the coverlay 112 of the inner core assembly and a dummy core 121 is positioned on the coverlay 114 of the inner core assembly. The dummy core 120 includes a conductive layer 118 and a non-conductive layer 116, and the dummy core 120 is oriented such that the conductive layer 118 is positioned against the coverlay 112. The type of coverlay used has a low adhesion to the material type of the conductive layer 118. This low adhesion enables removal of the dummy core 120 from the inner core assembly during a subsequent decap step shown and described in relation to FIG. 13. The dummy core 121 includes a conductive layer 119 and a non-conductive layer 117, and the dummy core 121 is oriented such that the conductive layer 119 is positioned against the coverlay 114. The type of coverlay used has a low adhesion to the material type of the conductive layer 119. This low adhesion enables removal of the dummy core 121 from the inner core assembly during the subsequent decap step.

An intervening non-conductive layer 140, such as regular flow prepreg, is positioned between the dummy core 120 and the core structure 122, and an intervening non-conductive layer 142, such as regular flow prepreg, is positioned between the dummy core 121 and the core structure 130. In the exemplary configuration shown in FIG. 8, additional conductive layer 146 and intervening non-conductive layer 138, such as regular flow prepreg, is added to the top of the stack and additional conductive layer 148 and intervening non-conductive layer 144, such as regular flow prepreg, is added to the bottom of the stack, where the terms top and bottom are used only in relation to the orientation shown in FIG. 8. A single lamination step results in the laminated stack shown in FIG. 8.

Figure 9:
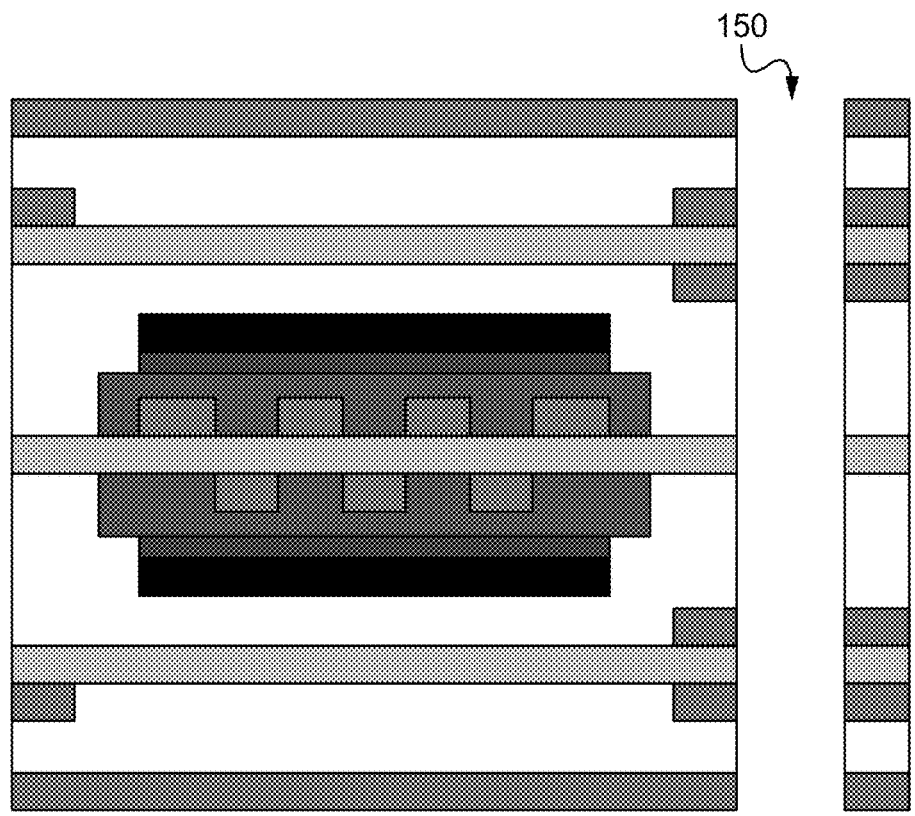

In FIG. 9, selective holes are drilled through the laminated stack of FIG. 8 to form vias, such as via 150. Vias are formed in those portions of the printed circuit board that will be rigid PCB portions.

Figure 10:
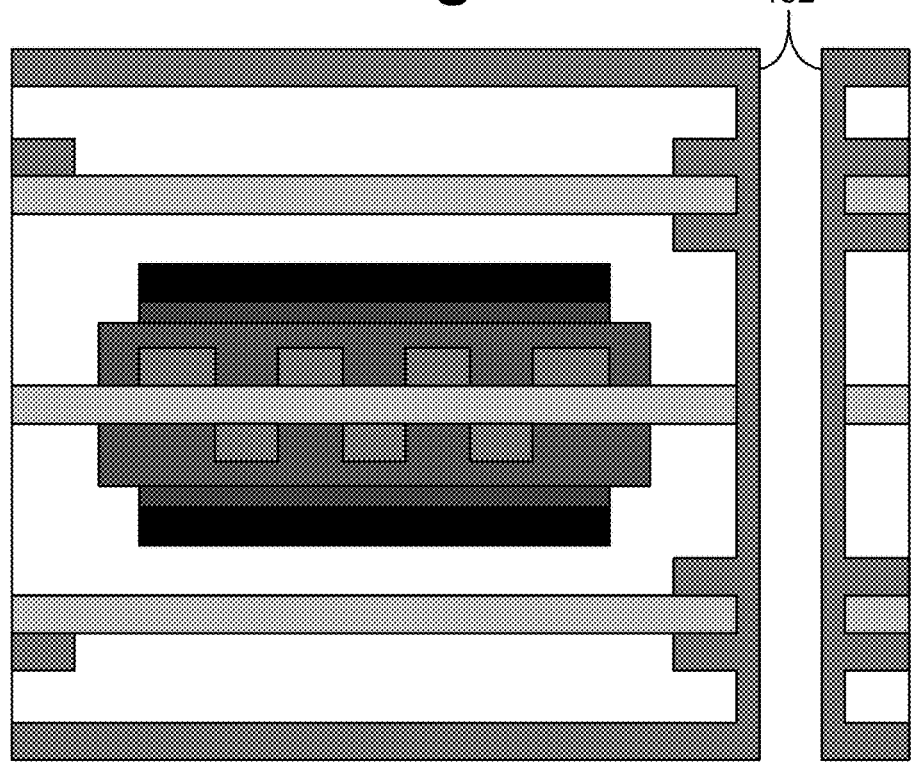

In FIG. 10, a desmear process is performed to remove residue, such as residual particles from the drilling of via 150. Next, an electroless plating process is performed to form plating 152 on the side walls of the via 150. In some embodiments, copper is used as the plating material. It is understood that other plating materials can be used. The plating 152 forms an interconnect with various conductive layers in the stack.

Figure 11:
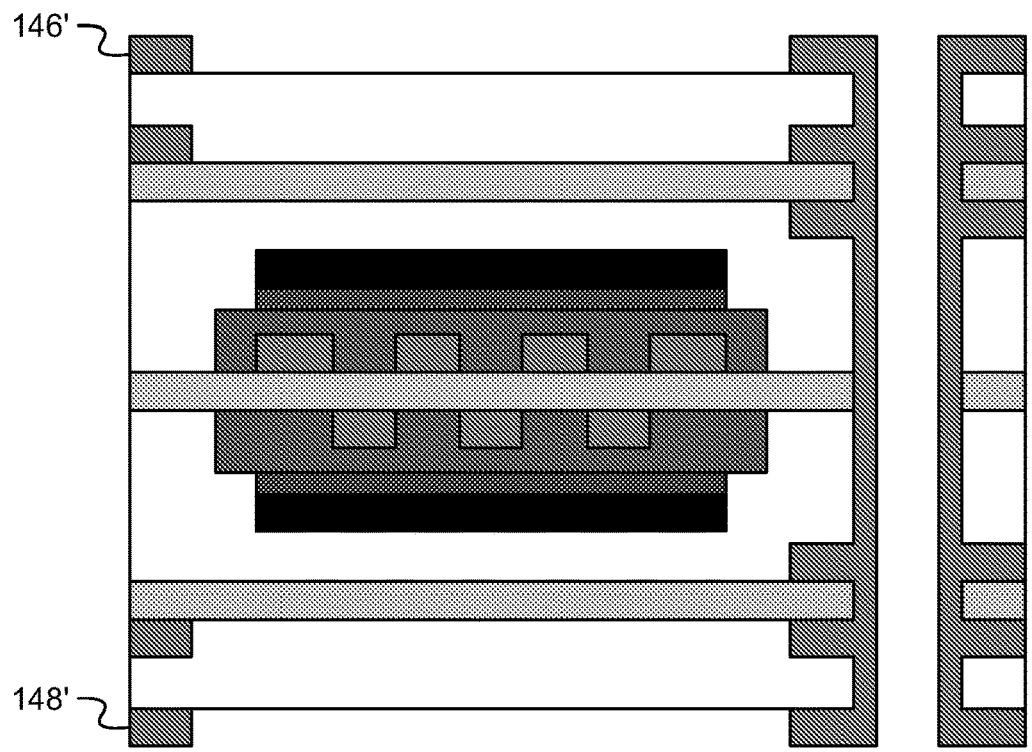

In FIG. 11, an outer conducting layer etching process is performed. The additional conductive layers 146 and 148 on the top and bottom, respectively, of the laminated stack are pattern etched to form patterned conductive layers 146' and 148'. In particular, the portions of the conductive layers 146 and 148 aligned with the dummy cores 120 and 121, respectively, are removed.

Figure 12:
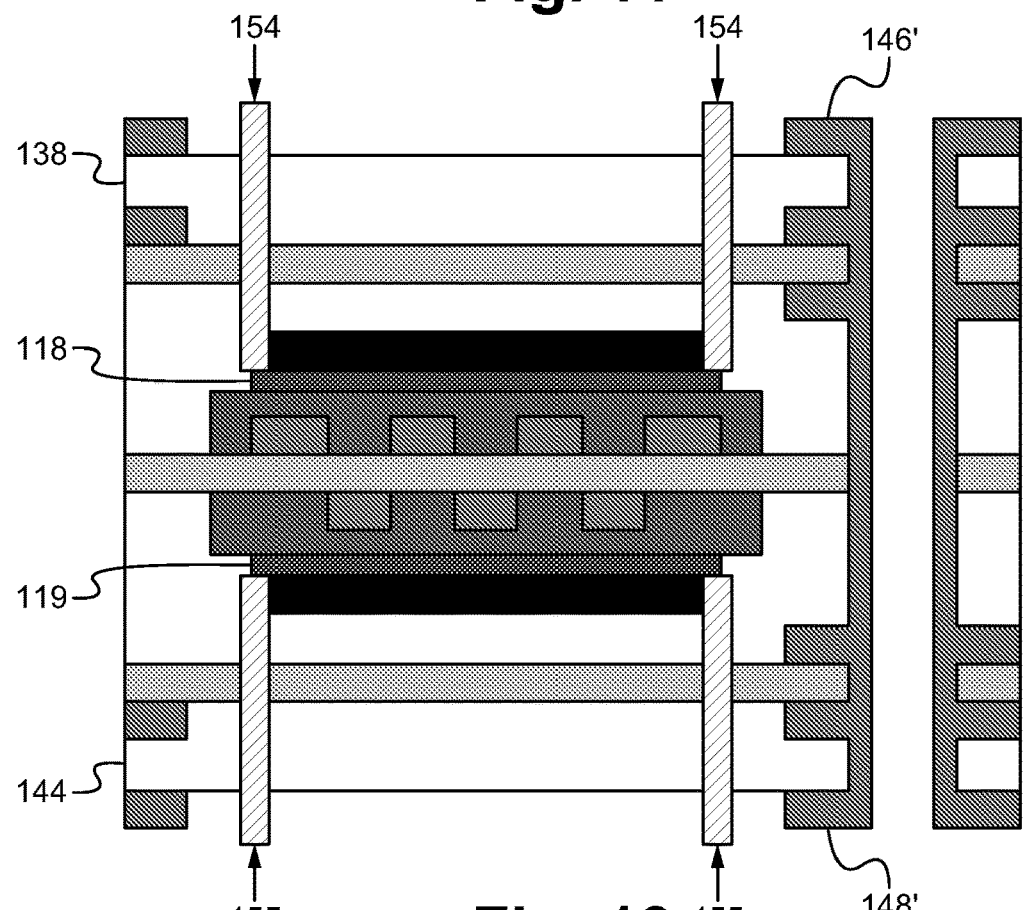
Figure 13:
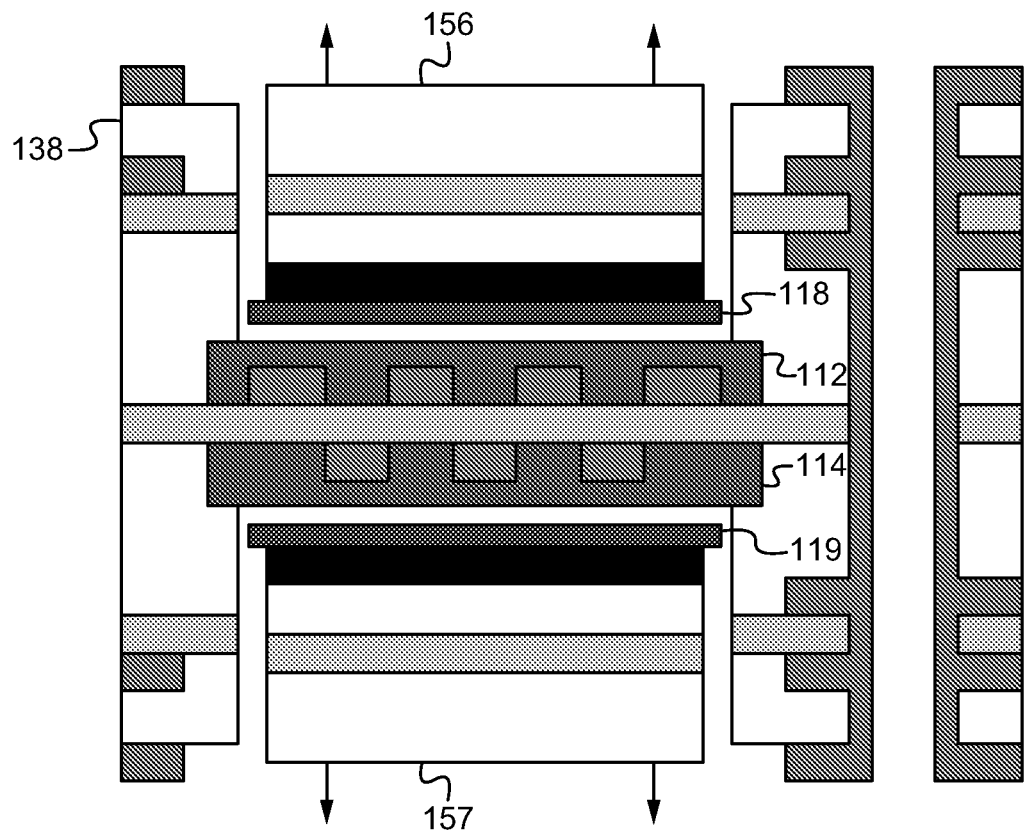

In FIG. 12, a depth controlled rout step is performed. In some embodiments, a routing tool having a rout bit is used to form a rout into the laminated stack to a depth of the conductive layer on the respective dummy core. As shown in FIG. 12, a rout 154 is made from the non-conductive layer 138 to the conductive layer 118 of the dummy core 120, and a rout 155 is made from the non-conductive layer 144 to the conductive layer 119 of the dummy core 121. FIG. 12 shows a two dimensional view of the rout 154 and 155. In three-dimensions, the routs 154 and 155 are formed at an outer perimeter of the dummy cores 120 and 121, respectively. A lateral rout is also performed such that the conductive layers 118 and 119 are free from surrounding prepreg material In FIG. 13, a plug 156 is removed and a plug 157 is removed, thereby exposing the coverlay 112 and 114, respectively. The plug 156 is the area within the rout 154 perimeter and between the non-conducive layer 138 and the conductive layer 118 of the dummy core 120. The plug 157 is the area within the rout 155 perimeter and between the non-conductive layer 144 and the conductive layer 119 of the dummy core 121. Removal of the plugs 156 and 157 is referred to as a decap process. The low adhesion between the conductive layer 118 and the coverlay 112, and between the conductive layer 119 and the coverlay 114 enables the plugs to simply be pulled apart from the coverlay.

Figure 14:
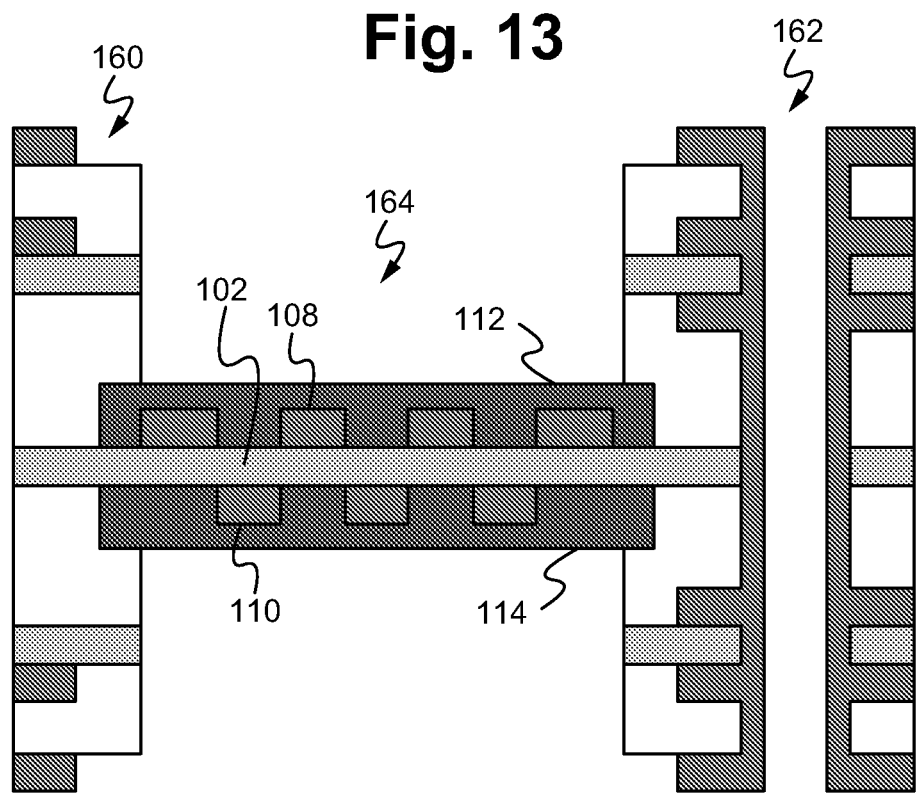

FIG. 14 shows the resulting printed circuit board after the decap process. The exposed coverlay 112, 114, inner core circuitry 108, 110 and corresponding non-conductive layer 102 form a flexible PCB portion 164. Remaining portions of the laminated stack form rigid PCB portions 160 and 162 on either end of the flexible PCB portion 164.

It is understood that the various structural configurations and the position of the inner core assembly shown in the embodiments of FIGS. 5-14 can be interchanged according to a specific application and application requirement.

FIGS. 2-14 show an exemplary configuration where both sides of the inner core circuitry are protected using coverlay and dummy core, and subsequently exposed. This is referred to as a double-sided configuration In other embodiments, the inner core circuitry is formed from an inner core structure that is positioned as the outer most layers of a PCB stack-up. In the case where both sides of the inner core structure have inner core circuitry, only the inward facing side need by protected using coverlay and a dummy core, the outward facing side is left uncovered by coverlay. In the case where the inward facing side of the inner core structure does not include inner core circuitry, coverlay need not be used and only a dummy core is used to form the flexible PCB portion. Either of these cases is referred to as a single-sided configuration. FIGS. 15-23 illustrate various steps in the process used to manufacture a printed circuit board according to other embodiments. The printed circuit board manufactured using the various steps shown in FIGS. 15-23 is similar to and shares features of the printed circuit board and constituent layers shown in FIGS. 5-14 except that the FIGS. 15-23 are directed to a single-sided process where the inward facing side of the inner core structure doe not include inner core circuitry. Each of the FIGS. 15-23 illustrate a cut out side view of the printed circuit board according to the various process steps.

Figure 15:
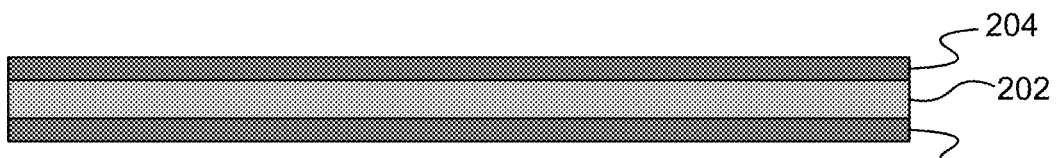
FIGS. 15-23 illustrate various steps in the process used to manufacture a printed circuit board according to other embodiments.

In FIG. 15, an exemplary inner core structure is shown. The inner core structure is a metal clad structure including a non-conductive layer 202 and conductive layers 204 and 206 formed on both opposing surfaces. It is understood that an alternative inner core structure can be used which includes a conductive layer on only one surface of the non-conductive layer. In some embodiments, the inner core structure is an FCCL.

Figure 16:

In FIG. 16, the conductive layer 206 is selectively pattern etched to form pattern etched conductive layer 208 and at least to expose surface 203 of the non-conductive layer 202. Alternatively, the conductive layer 206 is already pattern etched during fabrication of the inner core structure in FIG. 15. It is understood that FIG. 15-23 only show a portion of the printed circuit board and in particular only show a portion of the pattern etched layer 208. Additional interconnects and circuitry may be formed on portions of the inner core structure not shown in FIGS. 15-23, those portions to be included as part of a rigid PCB portion of the printed circuit board.

Figure 17:
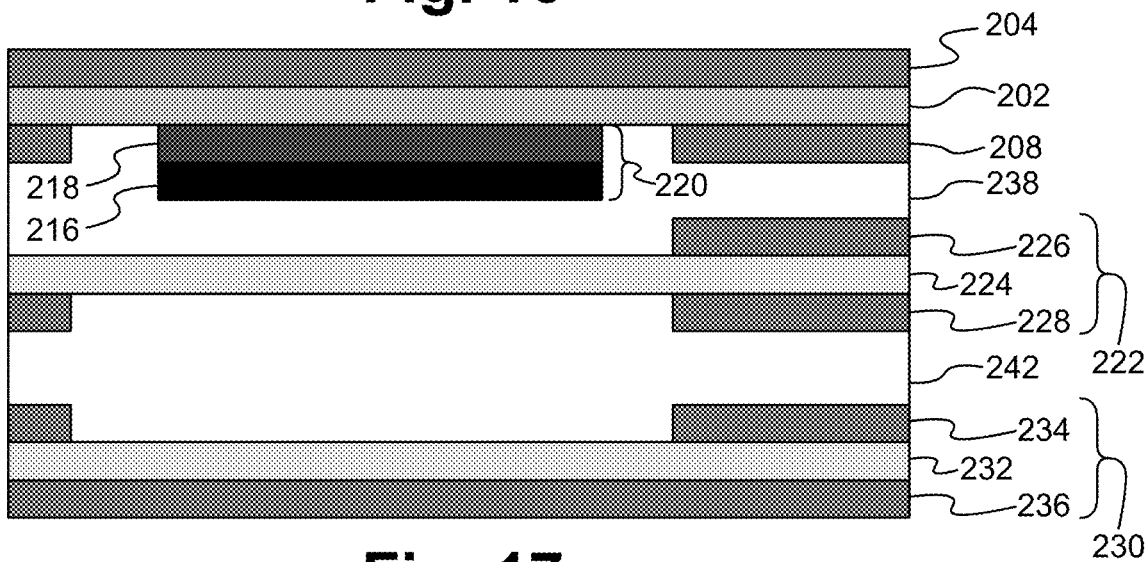

In FIG. 17, additional core structures and a dummy core structure are fabricated, and the core structures, the inner core structure of FIG. 16 and the dummy core structure are stacked with intervening non-conductive layers, such as regular flow prepreg. The additional core structures can be similar to the inner core structure of FIG. 15 with the conductive layers pattern etched accordingly. However, the conductive layers of the additional core structures positioned are formed such that the resulting interconnects will be positioned in a rigid PCB portion of the resulting printed circuit board. In those additional core structures that include portions of a subsequent plug to be removed during a decap process, the corresponding conductive layer portions can be etched away or left intact. In most instances, the additional core structures are made using a non-conductive base material as opposed to FCCL. In the exemplary configuration shown in FIG. 17, two additional core structures are included. A first core structure 222 includes a non-conductive layer 224 and conductive layers 226 and 228. The conductive layers 226 and 228 are selectively pattern etched. As shown in FIG. 17, the portions of the conductive layers 226 and 228 aligned with exposed surface 203 are removed. Alternatively, the portions of the conductive layers 226 and 228 aligned with the exposed surface 203 can be left intact. A second core structure 230 includes a non-conductive layer 232 and conductive layers 234 and 236. The conductive layers 234 and 236 are selectively pattern etched. As shown in FIG. 17, the portions of the conductive layers 234 and 236 aligned with the exposed surface 203 may include patterned interconnects.

A dummy core 220 is positioned on the exposed surface 203 of the inner core structure. The dummy core 220 includes a conductive layer 218 and a non-conductive layer 216. The dummy core 220 is oriented such that the conductive layer 218 is positioned against the exposed surface 203. The base material of the non-conductive layer 202 has a low adhesion to the material type of the conductive layer 218. This low adhesion enables removal of the dummy core from the inner core structure during a subsequent decap step shown and described in relation to FIG. 22.

An intervening non-conductive layer 238, such as regular flow prepreg, is positioned between the dummy core 220 and the core structure 222, and an intervening non-conductive layer 242, such a s regular flow prepreg, is positioned between the core structure 222 and the core structure 230.

Figure 18:
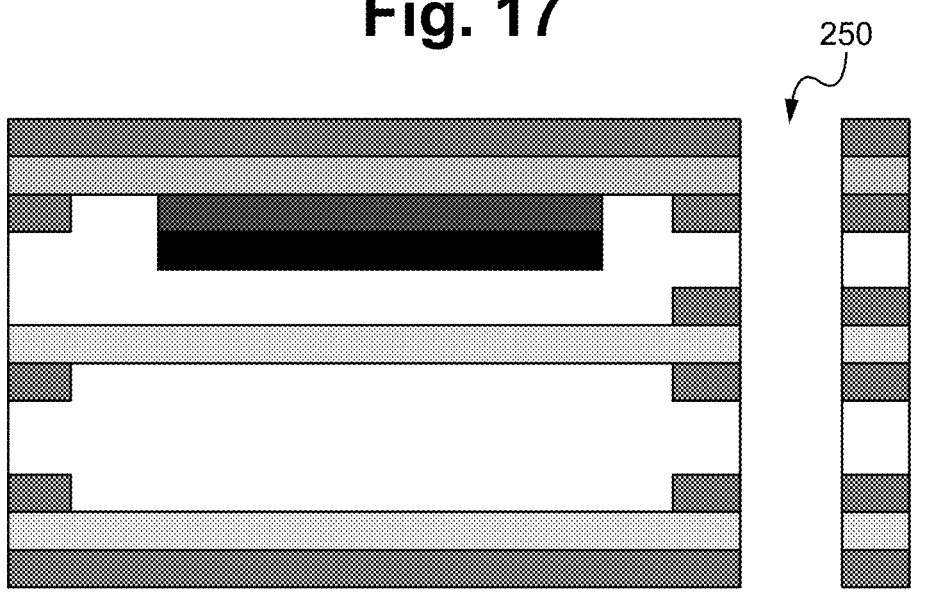

In FIG. 18, selective holes are drilled through the laminated stack of FIG. 17 to form vias, such as via 250. Vias are formed in those portions of the printed circuit board that will be rigid PCB portions.

Figure 19:
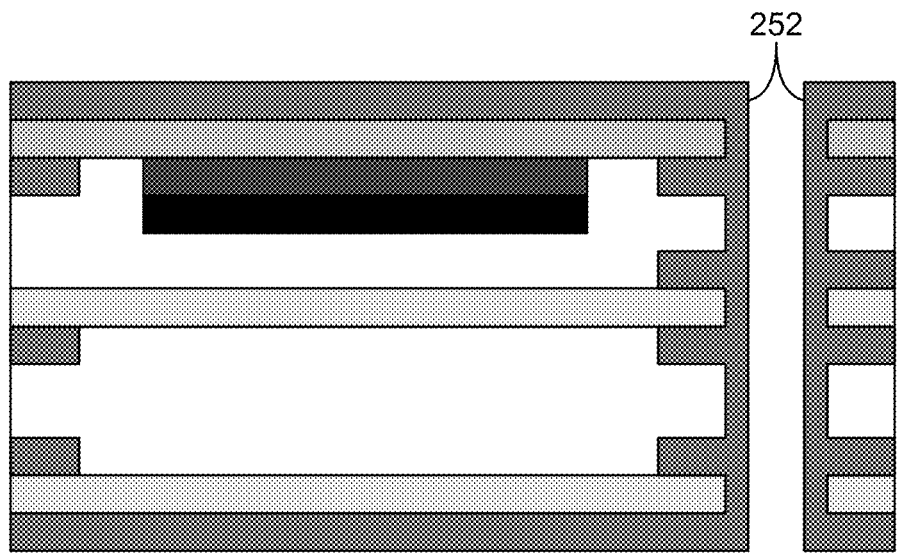

In FIG. 19, a desmear process is performed to remove residue, such as residual particles from the drilling of via 250. Next, an electroless plating process is performed to form plating 252 on the side walls of the via 250. In some embodiments, copper is used as the plating material. It is understood that other plating materials can be used. The plating 252 forms an interconnect with various conductive layers in the stack.

Figure 20:
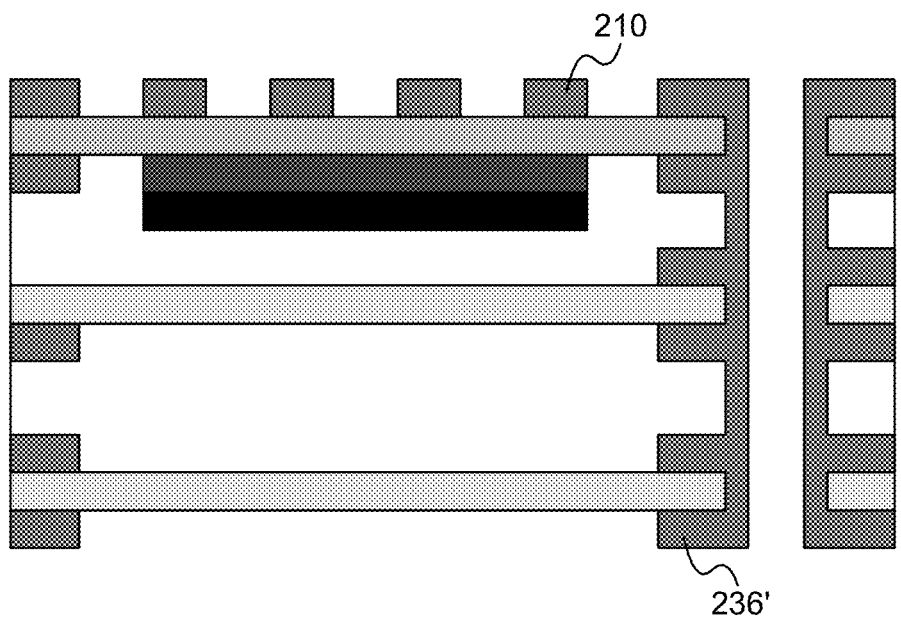

In FIG. 20, an outer conducting layer etching process is performed. The outward facing conductive layer 204 of the inner core structure is pattern etched to form inner core circuitry 210 and conductive layer 236 is pattern etched to form patterned conductive layers 236'. In particular, the portion of the conductive layers 246 aligned with the dummy core 220 is removed.

Figure 21:
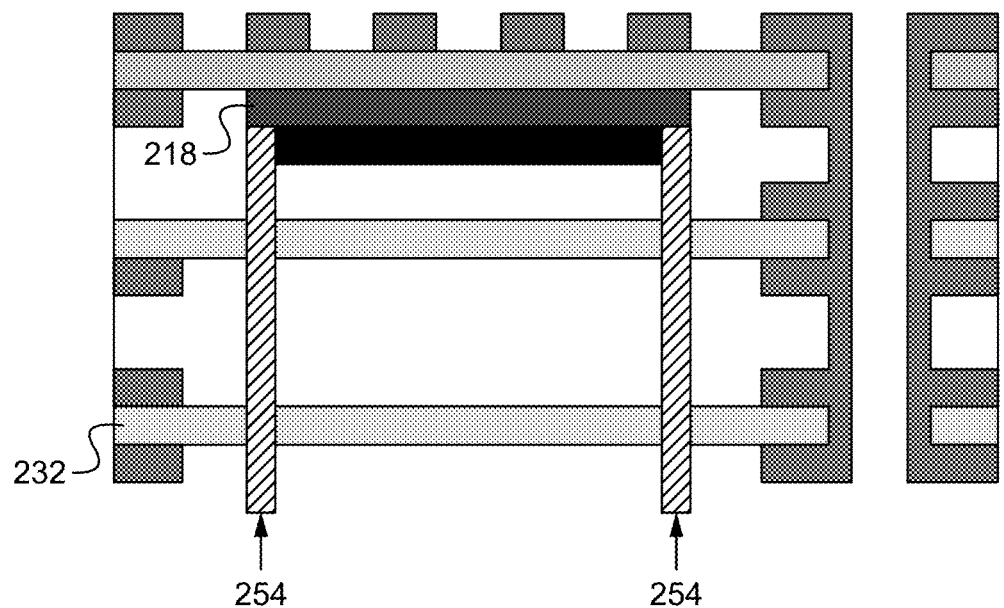

In FIG. 21, a depth controlled rout step is performed. As shown in FIG. 21, a rout 254 is made from the non-conductive layer 232 to the conductive layer 218 of the dummy core 220. FIG. 21 shows a two dimensional view of the rout 254. In three-dimensions, the rout 254 is formed at an outer perimeter of the dummy core 220. A lateral rout is also performed such that the conductive layer 218 is free from surrounding prepreg material.

Figure 22:
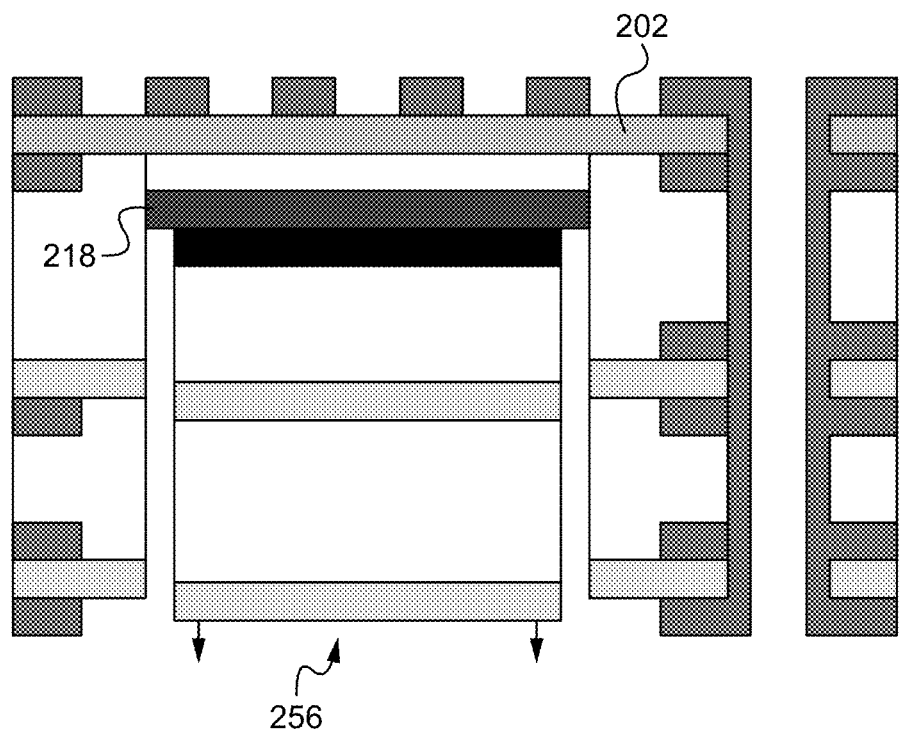

In FIG. 22, a plug 256 is removed, thereby exposing the surface 203 of the non-conductive layer 202. The plug 256 is the area within the rout 254 perimeter and between the non-conducive layer 232 and the conductive layer 218 of the dummy core 220. The low adhesion between the conductive layer 218 and the surface 203 enables the plug to simply be pulled apart from the non-conductive layer 202.

Figure 23:
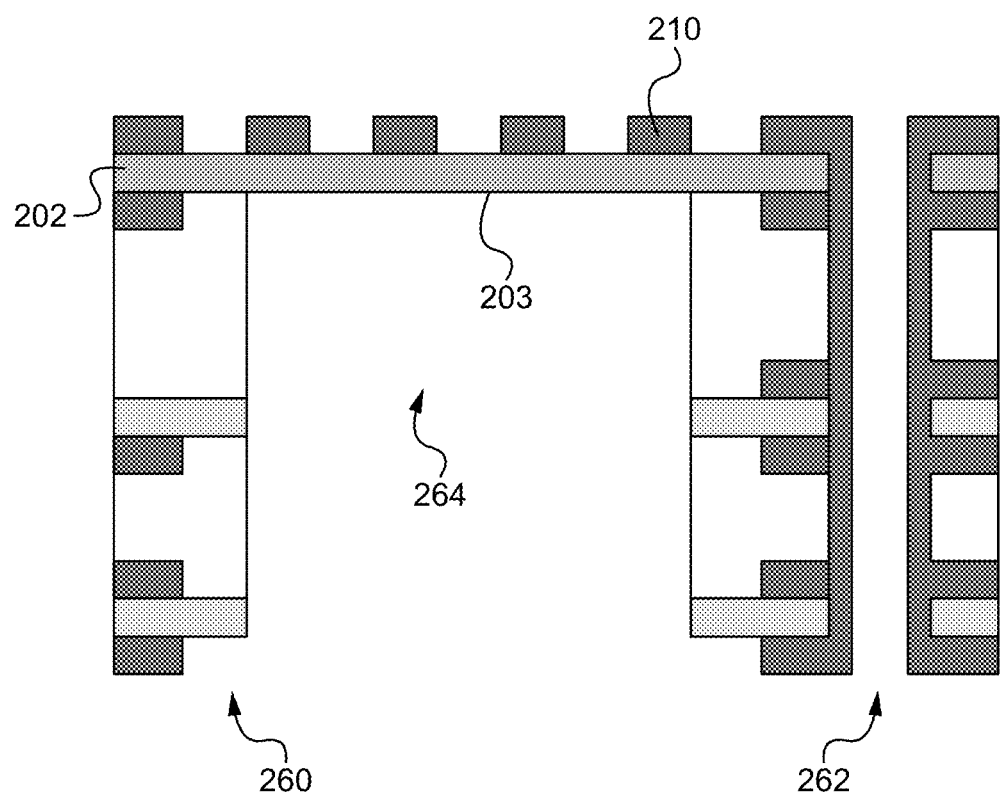

FIG. 23 shows the resulting printed circuit board after the decap process. The inner core circuitry 210 and the portion of the non-conductive layer 202 corresponding to the exposed surface 203 form a flexible PCB portion 264. Remaining portions of the laminated stack form rigid PCB portions 260 and 262 on either end of the flexible PCB portion 264.

It is understood that the various structural configurations shown in the embodiments of FIGS. 15-23 can be interchanged according to a specific applications and application requirement.

Figure 24:
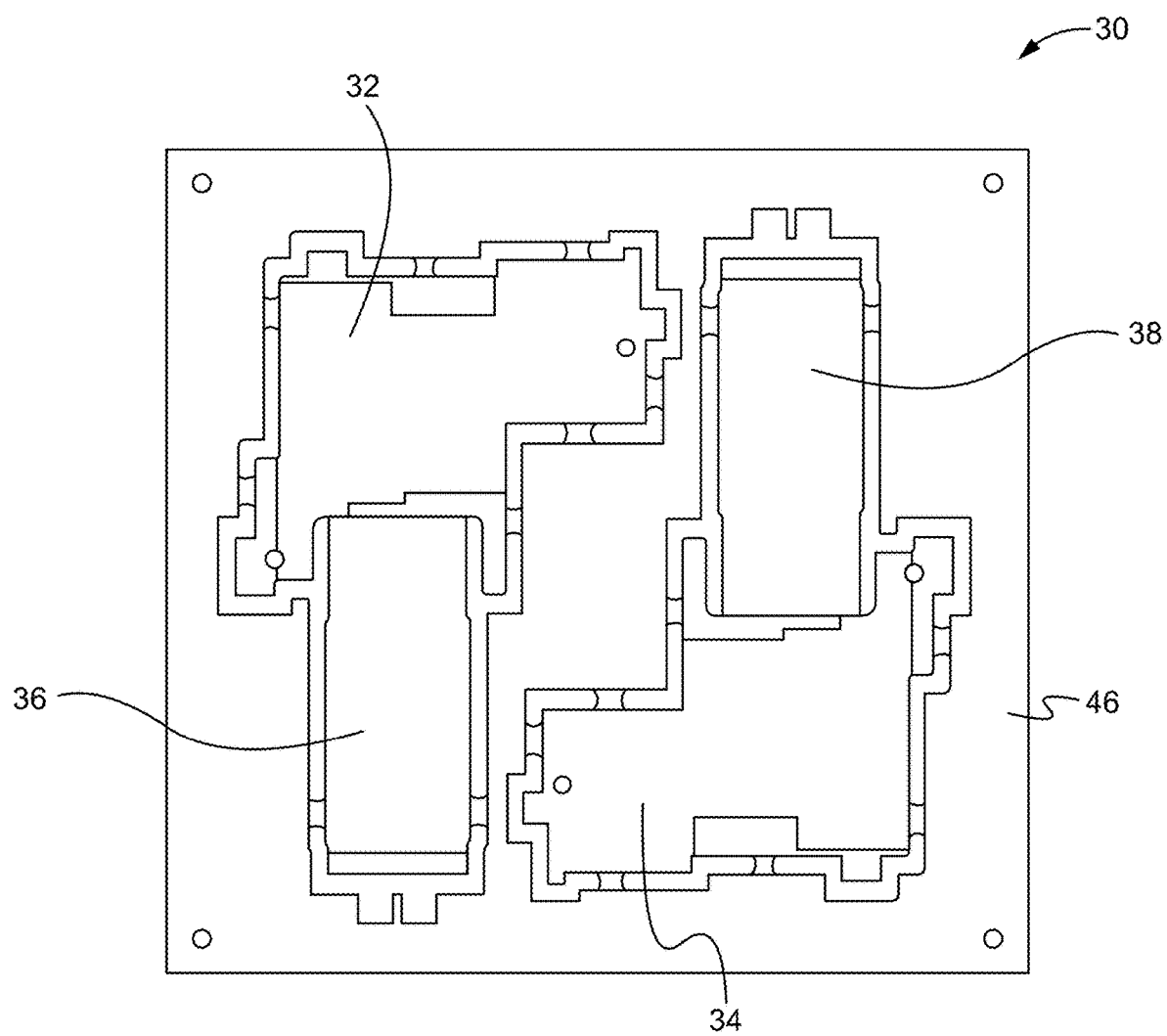
FIG. 24 illustrates an exemplary PCB set form according to an embodiment.

In some manufacturing processes, multiple PCBs are manufactured as discrete portions of a single substrate, which are separated into individual PCBs at the end of the manufacturing process. Such a single substrate configuration is referred to as a PCB set form. FIG. 24 illustrates an exemplary PCB set form according to an embodiment. The exemplary PCB set form 30 includes two PCBs. A first PCB includes a rigid PCB portion 32 and a flexible PCB portion 36. A second PCB includes a rigid PCB portion 34 and a flexible PCB portion 38. In contrast to the PCBs shown in FIGS. 14 and 23 that include two rigid PCB portions per PCB, the PCBs shown in FIG. 24 each include only a single rigid PCB portion. It is understood that PCB set forms can include more or less than the exemplary two PCBs shown in FIG. 24. The two PCBs are connected physically but not electrically. In some embodiments, an additional routing step is applied to an outer perimeter portion of a PCB set form. The additional routing step can be performed at any point in the printed circuit board manufacturing process after the lamination step is performed. For example, in the printed circuit board manufacturing process shown in FIGS. 5-14, the additional routing step can be performed at any point after the lamination step shown in FIG. 8. The additional routing step removes a perimeter portion of the laminated PCB stack up including the outer perimeter portion of the dummy core pattern, such as the outer perimeter portion 12 of FIG. 1. A resulting perimeter area surrounding the PCBs in the PCB set form 30 is shown in FIG. 24 as breakaway area 46.

The rigid PCB portions 32, 34 are ready for surface components to be mounted on select areas, such as through a surface mount technology (SMT) process. After the components are mounted, the PCBs are separated for subsequent installation into other devices. Separating the PCBs can be performed using any conventional process including, but not limited to, cutting the PCB set form 30 along etched lines. Cutting along the perimeter etch lines separates the breakaway area 46 from the PCBs.

Figure 25:
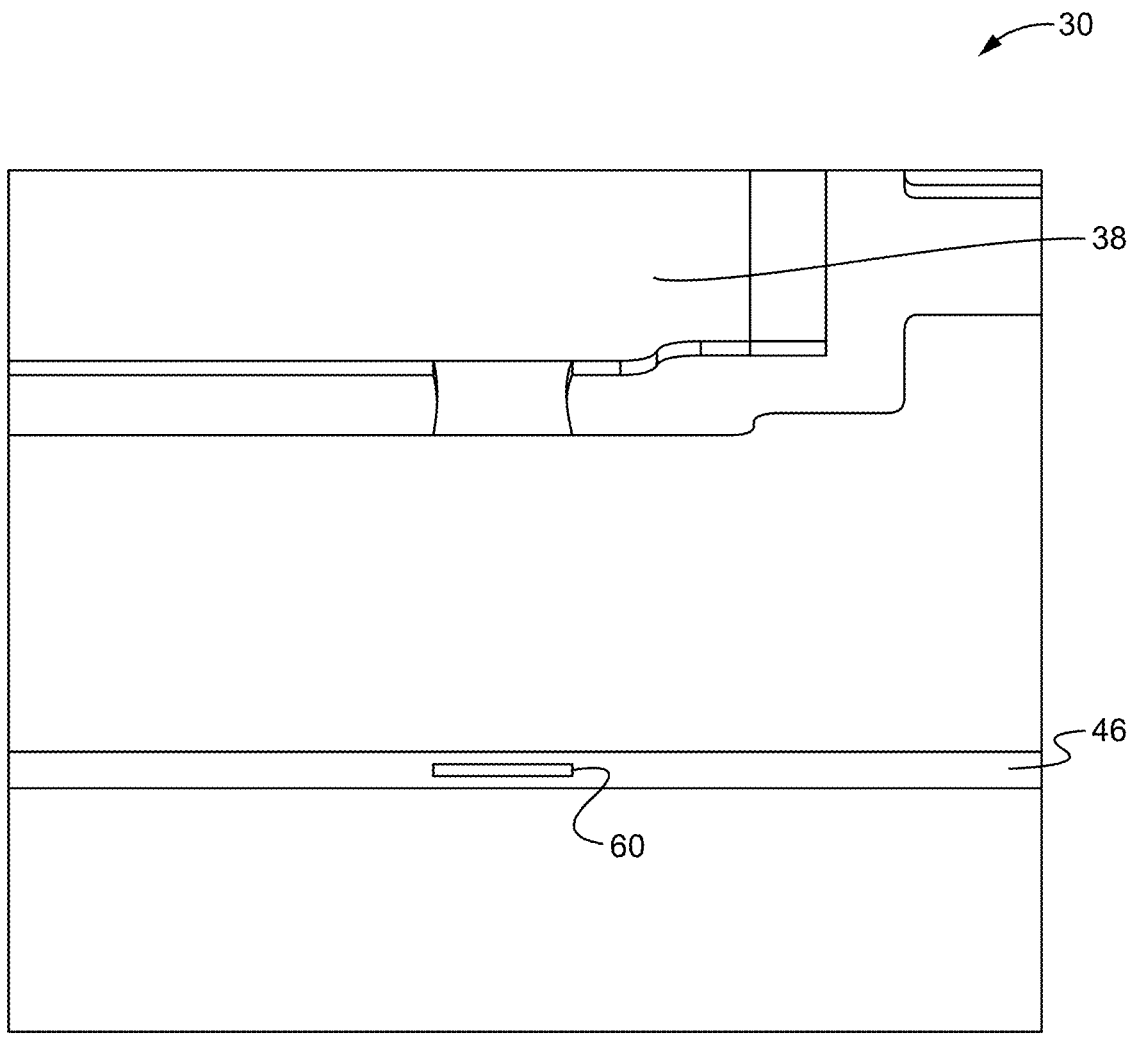
FIG. 25 illustrates a perspective side view of the PCB set form 30 of FIG. 24.

FIG. 25 illustrates a perspective side view of the PCB set form 30 of FIG. 24. The breakaway area 46 includes a dummy core portion 60, which is a remnant of a dummy core pattern used to protect the flexible PCB portion 38 of FIG. 24. As exemplified in FIG. 1, a dummy core pattern can include an interconnect portion, such as the interconnect portion 10 of the dummy core pattern 6 in FIG. 1, a portion of which coincides with the breakaway area of a PCB set form, such as the breakaway area 46 in FIG. 25. As such, although the outer perimeter portion of the dummy core pattern, such as the outer perimeter portion 12 in FIG. 1, as well as the overlay portions of the dummy core pattern that are applied over the coverlay and corresponding inner core circuitry, such as the overlay portions 8 in FIG. 1, are removed during the PCB manufacturing process, the interconnect portions that connect to the outer perimeter portion of the dummy core pattern remain.

In some embodiments, the flexible PCB portions can be formed as connector sections between rigid PCB portions, such as the configuration shown in FIG. 24. The flexible PCB portion is flexible thereby enabling two adjoining rigid PCB portions to rotate, or pivot, relative to each other.

The printed circuit board and manufacturing processes described herein provided numerous advantages. The printed circuit board having both rigid PCB portions and a flexible PCB portions is formed using regular flow prepreg. In prior art printed circuit boards, flexible PCB portions are formed using low flow prepreg as well as lamination accessories such as release film and conformal film. Use of low flow prepreg is needed to control squeeze out during lamination. However, since low flow prepreg is used, a greater lamination pressure is required which results in surface ripple on the PCB exterior surfaces. Under high pressure the underlying topography of the inner layer circuitry is reflected on the surface resulting in the irregular, or rippled, surface. In the present application, there is no need to control resin squeeze out, there is no limitation in prepreg selection, there is no need of lamination accessories or high lamination pressure, which results in a flat exterior surfaces. The present process improves board flatness that solves impedance control issues and improves reliability of surface mounted component connections. Yield of fine line 2/2 mil etching and soldermask fine line imaging is also improved because of the flat exterior surfaces. Without use of lamination accessories and yield improvement, the process of the present application saves running cost dramatically. Higher pressure lamination as used in conventional processes leads to expansion in the X-Y plane of the PCB. Such lateral expansion moves surface contact pads relative to their designed positions. The present process uses standard lamination pressure and therefore reduces lateral expansion. Such dimensional control is becoming more and more significant with smaller and smaller pitch components to be surface mounted.

The printed circuit board and manufacturing process described herein also resolves the resin squeeze out issue at the rigid-flex boundary. In the present process, a well controlled and regular rigid-flex boundary is achieved while the prior art processes have poor control and irregular rigid-flex boundary which varies lot by lot. Conventional processes using low flow prepreg result in rougher, more irregular rigid-flex boundary. Such an irregular boundary affects reliability of the flexible PCB portion. In the current application, resin flow is restricted by the dummy core and a rigid-flexible boundary is defined by depth control rout. Therefore, the rigid-flexible boundary is substantially smooth and regular.

The present process also enables precise removal of the plug using the described decap process steps.

Standard rigid PCB design can be transferred to rigid-flex design smoothly using the present process, this expands product categories such as HDI, ELIC, 0.3 mm BGA pitch and sequential lamination, and hence increases business opportunities.

An advantage of using the coverlay and dummy core in the manufacturing process is that relatively early in the manufacturing process a final circuit surface, for example the inner core circuitry, can be prepared and protected during subsequent process steps. The final covered circuit surface can be re-exposed from other layers of a PCB laminated stack later in the process without having been contaminated.

The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of manufacturing a printed circuit board comprising:
    a. forming an inner core structure having an inner core circuitry on at least one surface of the inner core structure;
    b. applying a coverlay material over the inner core circuitry;
    c. forming a printed circuit board stack up, wherein the printed circuit board stack up comprises the inner core structure, a dummy core, one or more non-conductive layers and one or more conductive layers, wherein the dummy core is a metal clad base material, wherein the dummy core is stacked on the coverlay material;
    d. laminating the printed circuit board stack up, thereby forming a laminated stack;
    e. forming a depth controlled rout from a surface of the laminated stack to the dummy core and around a perimeter of the dummy core, wherein a portion of the laminated stack within the perimeter of the rout and to a depth including the dummy core forms a laminated stack cap;
    f. removing the laminated stack cap, thereby exposing the coverlay material and forming a flexible portion of the printed circuit board.

2. The method of claim 1 wherein the perimeter of the dummy core corresponds to a perimeter of the inner core circuitry.

3. The method of claim 1 further comprising forming the dummy core, wherein the dummy core comprises a non-conductive layer and a conductive layer.

4. The method of claim 3 wherein the dummy core is stacked on the coverlay material such that the conductive layer of the dummy core contacts the coverlay material.

5. The method of claim 1 further comprising forming at least one plated through hole via in the laminated stack prior to forming the depth controlled rout, wherein the at least one plated through hole via is not aligned within the inner core circuitry.

6. The method of claim 1 further comprising pattern etching the conductive layers in the laminated stack prior to forming the printed circuit board stack up.

7. The method of claim 1 wherein forming the inner core structure comprises applying a first conductive layer on a first surface of a non-conductive layer and applying a second conductive layer on a second surface of the non-conductive layer.

8. The method of claim 7 wherein the first conductive layer is pattern etched and the second conductive layer is pattern etched.

9. The method of claim 1 wherein the one or more non-conductive layers comprise one or more regular flow prepreg layers.

10. The method of claim 9 wherein laminating the printed circuit board stack up comprises applying a standard lamination pressure less than about 450 psi.

11. The method of claim 10 wherein a remaining portion of the laminated stack outside the perimeter of the rout forms a rigid portion of the printed circuit board, wherein an exposed outer surface of the laminated stack is smooth and non-rippled due to laminating the printed circuit board stack up using regular lamination pressure and the inclusion of regular flow prepreg.

12. A method of manufacturing a printed circuit board comprising:
    providing a first core including core circuitry;
    providing a dummy core having a conductive layer adhered to a base material, wherein the dummy core defines one or more overlay areas and one or more open areas extending therethrough that are free of material;
    forming a printed circuit board stack up, wherein the printed circuit board stack up includes the first core, the dummy core, a prepreg layer and one or more conductive layers, wherein the dummy core is disposed adjacent the first core and the prepreg layer is disposed adjacent the dummy core, wherein the first core is disposed adjacent a first surface of the dummy core and the prepreg layer is disposed adjacent a second surface of the dummy core, the second surface reverse of the first surface;
    laminating the printed circuit board stack up, thereby forming a laminated stack;
    depth controlled routing from a surface of the laminated stack to the dummy core and around a perimeter of the one or more overlay areas, wherein a portion of the laminated stack within the perimeter of the one or more overlay areas and to a depth including the dummy core forms a laminated stack cap; and
    removing the laminated stack cap, wherein the laminated stack cap separates from a remainder of the laminated stack at a boundary of the dummy core and the first core.

13. The method of claim 12 wherein forming a printed circuit board stack up includes disposing the one or more first overlay areas to cover at least a portion of the core circuitry.

14. The method of claim 12 wherein routing includes routing with a routing bit.

15. The method of claim 12, wherein the first core is a laminate.

16. The method of claim 12, wherein forming a printed circuit board stack up includes disposing the conductive layer of the dummy core to contact a first surface of the first core.

17. The method of claim 16, wherein forming a printed circuit board stack up includes disposing the prepreg layer to contact the base material of the dummy core.

18. The method of claim 17, wherein the non-conductive material of the first core is a coverlay over the core circuitry.

19. The method of claim 17, wherein the non-conductive material of the first core is a non-conductive layer on which the core circuitry is disposed.

20. The method of claim 17, wherein the non-conductive layer is flexible.

21. The method of claim 16, wherein the conductive layer of the dummy core contacts a non-conductive material of the first core.

22. The method of claim 12 wherein the one or more conductive layers in the stack-up include:
   a second core having circuitry; and
   wherein the second core is disposed adjacent the prepreg layer, the second core disposed adjacent a surface of the prepreg layer that is reverse of a surface of the prepreg layer adjacent the dummy core.

23. The method of claim 22, wherein the second core is a laminate.

24. The method of claim 12 wherein the prepreg layer has a resin flow greater than about 100 mil.

25. The method of claim 12 wherein laminating the printed circuit board stack up comprises applying a standard lamination pressure less than about 450 psi.

26. The method of claim 12, wherein the first core is disposed as an inner layer in the stack up.

27. The method of claim 12, wherein the first core is disposed as an outer layer of the stack up.

* * * * *